United States Patent [19]
Miyakawa

[11] Patent Number: 5,981,971
[45] Date of Patent: Nov. 9, 1999

[54] SEMICONDUCTOR ROM WAFER TEST STRUCTURE, AND IC CARD

[75] Inventor: Tadashi Miyakawa, Yokohama, Japan

[73] Assignee: Kabushiki Kaisha Toshiba, Kawasaki, Japan

[21] Appl. No.: 09/041,727

[22] Filed: Mar. 13, 1998

[30] Foreign Application Priority Data

Mar. 14, 1997 [JP] Japan ................................... 9-079194

[51] Int. Cl.⁶ ................................................. G01R 31/26
[52] U.S. Cl. ........................... 257/48; 257/922; 365/195; 324/765
[58] Field of Search ....................... 257/48, 922; 438/18, 438/462; 365/63, 195, 94; 324/765

[56] References Cited

U.S. PATENT DOCUMENTS

| | | | |
|---|---|---|---|
| 4,243,937 | 1/1981 | Multani et al. | 257/48 X |
| 4,446,475 | 5/1984 | Gerekci et al. | 257/48 |
| 5,059,899 | 10/1991 | Farnworth et al. | 257/48 X |
| 5,739,546 | 4/1998 | Saitou et al. | 257/48 |

FOREIGN PATENT DOCUMENTS

| | | | |
|---|---|---|---|
| 62-81724 | 4/1987 | Japan | 257/48 |
| 62-261139 | 11/1987 | Japan | 257/48 |
| 2-211648 | 8/1990 | Japan | 257/48 |

OTHER PUBLICATIONS

D. E. Shultis, "Semiconductor Wafer Testing," IBM Technical Disclosure Bulletin, vol. 13, No. 7, Dec. 1970, p. 1793.

*Primary Examiner*—John Guay
*Attorney, Agent, or Firm*—Foley & Lardner

[57] ABSTRACT

In a semiconductor wafer (1), an internal circuit such as a ROM formed at a product region or a chip (2) can be tested via a test pad (5) formed on a scribe line (3). Here, since the test pad (5) is formed on the scribe line (3), after the semiconductor wafer has been once cut off and separated away from each other as chips along the scribe lines (3), respectively, since the test pads (5) are all broken off, ROM test will not be executed again. In other words, since the test conditions of the product test of the separated chip (2) cannot be decoded or deciphered by another person, it is possible to provide a semiconductor device of high secrecy, which can be preferably used as an IC card.

12 Claims, 5 Drawing Sheets

SEMICONDUCTOR ROM WAFER TEST STRUCTURE, AND IC CARD

BACKGROUND OF THE INVENTION

1. Field of the Invention

The present invention relates to a semiconductor wafer, a method of-manufacturing a semiconductor device having a ROM (read only memory), and an IC card. More specifically, the present invention relates to a test terminal (referred to as a test pad, hereinafter) used to test the ROM of the semiconductor device formed on the semiconductor wafer.

2. Description of the Background Art

Conventionally, a semiconductor wafer (e.g., silicon wafer) is separated into a plurality of chips, after having been cut off along scribe lines (or scribe regions). Further, the obtained chips are manufactured as various semiconductor devices, after each chip has been processed (e.g., package process) appropriately. In this manufacturing process, it is usual to execute some tests (e.g., die sorting test, product test, etc.) for the semiconductor wafer, before the chips are processed as device products.

Figure 9:
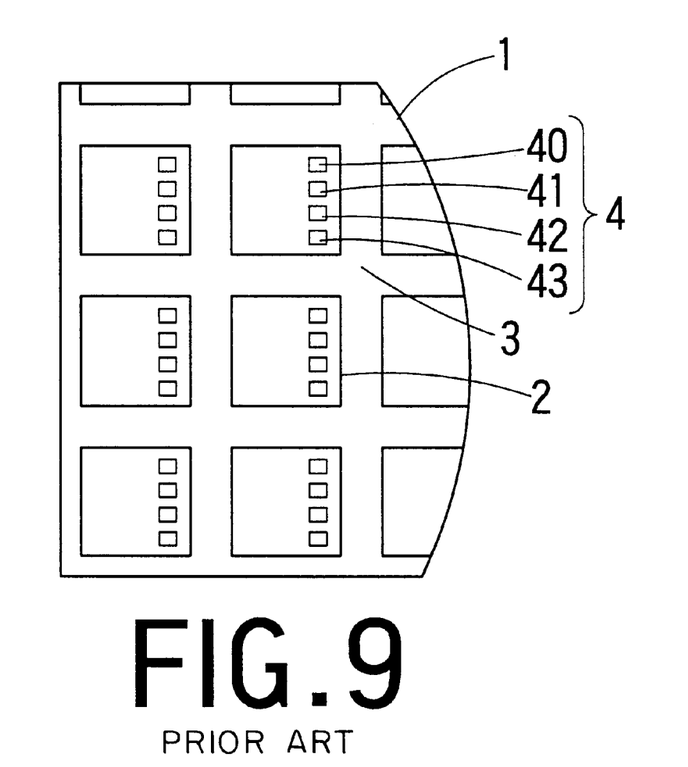
FIG. 9 is a plane view showing a conventional semiconductor wafer.

FIG. 9 is a partial plane view showing a conventional semiconductor wafer. On a semiconductor wafer 1, there are arranged a plurality of product regions 2 each separated into a chip in the last step. Further, a plurality of scribe regions 3 are formed between two of these product regions 2, respectively. Further, an internal circuit composed of integrated circuits such as ROM, transistors, etc. is formed at each product region 2. Further a plurality of aluminum pads 41 to 43 are formed so as to be connected to an external circuit electrically. On the other hand, these pads 4 are electrically connected to the internal circuit, and arranged at a peripheral portion, for instance at the product region 2, respectively. In addition, a test pad 40 is also arranged together with these input and output pads 41, 42 and 43, respectively.

In the IC test of the conventional semiconductor device, these test pads 40 to 43 as shown in FIG. 9 are used. Here, these pads 4 including the input and output pads 41 to 43 and the test pad 40 are all arranged on the inside of the scribe line 3, that is, at the product region 2, respectively. Further, when the die sorting test is executed during the manufacturing process, some needles (e.g., probes) are brought into contact with these pads 4. Further, when the product test is executed, some voltages and some signals are inputted through the bonded pads of the semiconductor device, and some signals are outputted through an appropriate pad. As described above, in the case of the semiconductor wafer, the tests (i.e., the die sorting test, the product test, etc.) must be executed at least once, respectively as a rule. In particular, the ROM test at the product region 2 is executed in the same process as the other tests. Therefore, in case the test conditions of the semiconductor products manufactured after the scribe step and then put on the market are decoded or deciphered by some method or other, since the ROM test conditions can be known and realized by another person, it is possible to read the contents of the ROM of the semiconductor device. In particular, when the semiconductor device is used for the electronic transactions, in case the contents of the ROM are read and decoded (deciphered), there exists such a danger that the read contents are used improperly or illegally.

With the advance of the recent development of the semiconductor devices, it has become possible to execute the electronic transactions by use of these semiconductor devices (e.g., IC cards). When the electronic transactions are put to practical use in the field of electronic commerce, there exists such a large advantage that the transactions can be executed momentarily through a network. In order that the electronic transactions can be accepted from a social point of view, although there exists a large problem of how to construct its social system, in particular the development related to security technology for the semiconductor devices is the most important problem to be solved. Here, the important problems related to security in the internet system are four of "look furtively", "alter documents", "impersonate another person", and "pretend not to know". Here, "look furtively" implies that the important information is known by a third person in the network. In the electronic transactions, the card number data is known by another person and used illegally. "alter documents" implies that the important information is rewritten in the networks. In the case of the electronic transactions, when the value of money is designated so as to be transferred between the two accounts, the transferred account is rewritten. Or else, when the electronic money is remitted, an amount of money to be remitted is rewritten. "impersonate a person" implies to transmit information by impersonating another person, because the person's face cannot be seen in the network. In the electronic transactions, a consumer is deceived by a retail shop pretending a socially fine reputation, requested to remit electronic money, and thereby defrauded of the remitted electronic money. "pretend not to know" is to deny that electronic money is not yet received, in spite of the fact that the electronic money has been already remitted. In the electronic transactions, in spite of the fact that a commodity sent by a retail shop has been already received, a consumer pretends not to receive the commodity.

However, since these problems can be soon solved with the advance of the technical development, the relative importance of the problems related to the electronic transactions and the electronic money will be shifted to the social system. In addition, in order to construct the society where the electronic transactions and the electronic money can be both accepted socially, it is necessary to change the paradigm from "security" to "comfort" (See NIKKEI ELECTRONICS 1996, 12, 16 pp171–181).

Therefore, in order to secure the security of the electronic transactions and electronic money, it Is important to prevent the contents of the semiconductor device such as an IC or LSI from being known by another person. When the test conditions of the semiconductor device products already put on the market are decoded by some way or other and thereby the test conditions of the ROM can be realized by another person, since the contents of the ROM can be read, in the case of the semiconductor device used for electronic transactions, it has been necessary to eliminate such a danger that the contents of the ROM are decoded and used illegally.

SUMMARY OF THE INVENTION

With these problems in mind, therefore, it is the object of the present invention to provide a semiconductor wafer, on which a semiconductor device of high secrecy and high security can be formed in such a way that the test conditions of the product tests will not be decoded by another person, and a method of manufacturing the same semiconductor device.

To achieve the above-mentioned object, the present invention provides a semiconductor wafer formed with a plurality of chips each having a ROM to be tested, comprising: a plurality of product regions arranged in a matrix pattern on the semiconductor wafer and cut away into each chip having a ROM in which data are written; a plurality of scribe lines each formed between two of said product regions as a margin to separate said product regions from each other; and a plurality of test pads each formed on each of said scribe lines in the vicinity of each of said product regions in one-to-one correspondence to each product region so as to be used for ROM test, each of said test pads formed on each scribe line being broken off whenever each of said scribe lines is cut away to disable the ROM test from being executed.

Here, it is preferable that each test pad is formed on each scribe line adjacent to each product region corresponding to each test pad.

Further, it is preferable that each test pad is formed at roughly a middle point of each scribe line.

Further, it is preferable that each test pad and each product region corresponding to each test pad are electrically connected to each other by a diffusion region formed on a surface of the semiconductor wafer so as to extend from each product region over to each scribe line on which each test pad is formed.

Further, it is preferable that the diffusion region is in contact with each test pad at one end thereof and in contact with a test control circuit formed at each product region at the other end thereof, to control the ROM test.

Further, it is preferable that the diffusion region is electrically connected to the test control circuit by a wire brought into contact with the other end of the diffusion region and into contact with a gate of a switching transistor formed on an input/output terminal side of the test control circuit.

Further, it is preferable that the wire is a poly silicon wire extending to the gate integral with the gate so as to be electrically connected to the gate.

Further, it is preferable that the diffusion region is grounded via a resistance.

Further, it is preferable that a plurality of the ROMs are formed on each of said product regions.

Further, the present invention provides an IC card comprising: an external device; and a semiconductor chip mounted on said external device and obtained by cutting off a semiconductor wafer formed with a plurality of chips each having a ROM to be tested, including: a plurality of product regions arranged in a matrix pattern on the semiconductor wafer and cut away into each chip having a ROM in which data are written; a plurality of scribe lines each formed between two of said product regions as a margin to separate said product regions from each other; and a plurality of test pads each formed on each of said scribe lines in the vicinity of each of said product regions in one-to-one correspondence to each product region so as to be used for ROM test, each of said test pads formed on each scribe line being broken off whenever each of said scribe lines is cut away to disable the ROM test from being executed.

Further, the present invention provides a method of manufacturing a semiconductor device, comprising: a step of forming a semiconductor wafer formed with a plurality of product regions each formed on a wafer surface and including ROMs, a plurality scribe lines each formed on the wafer surface, and a plurality of test pads each formed on each of the scribe lines: a step of executing a first test for checking whether data can be written in writable ROMs of the ROMs formed on the semiconductor wafer via the test pads, respectively; a step of writing data in the writable ROMs of the ROMs formed on the semiconductor wafer, respectively; a step of executing a second test for checking whether data have been written properly in the writable ROME of the ROMs via the test pads, respectively on the basis of a result of the first test; a step of cutting off the semiconductor wafer along the scribe lines to separate the product regions into chips, respectively; and a step of packaging the separated chips to obtain semiconductor products, respectively.

Further, it is preferable that in the step of forming the semiconductor wafer, a plurality of diffusion regions are formed on the wafer surface in such a way as to each extend from each product region over to each scribe line, for electrical connection between each test pad and each ROM.

The present invention provides a high-confidential semiconductor wafer characterized in that the internal circuit including a ROM, for instance can be tested through a test pad formed on a scribe line. Here, since the test pad is so arranged as to be broken off on the semiconductor wafer whenever the semiconductor wafer :s once cut off into many chips along the scribe lines, respectively, the ROM test will not be executed again even by the maker, with the result that it is possible to provide the semiconductor devices of a high secrecy.

DETAILED DESCRIPTION OF THE PREFERRED EMBODIMENTS

Embodiments of the semiconductor wafer according to the present invention will be described in detail hereinbelow with reference to the attached drawings.

The feature of the present invention Is to provide a high-confidential semiconductor wafer, by which the internal circuit including a ROM, for instance can be tested through a test pad formed on a scribe line and electrically connected to a diffusion region connected to a test control circuit formed at a chip forming region. In addition, the test pad is so arranged as to be broken off after having been cut off along the scribe line.

A first embodiment thereof will be first described with reference to FIGS. 1 to 5.

Figure 1:
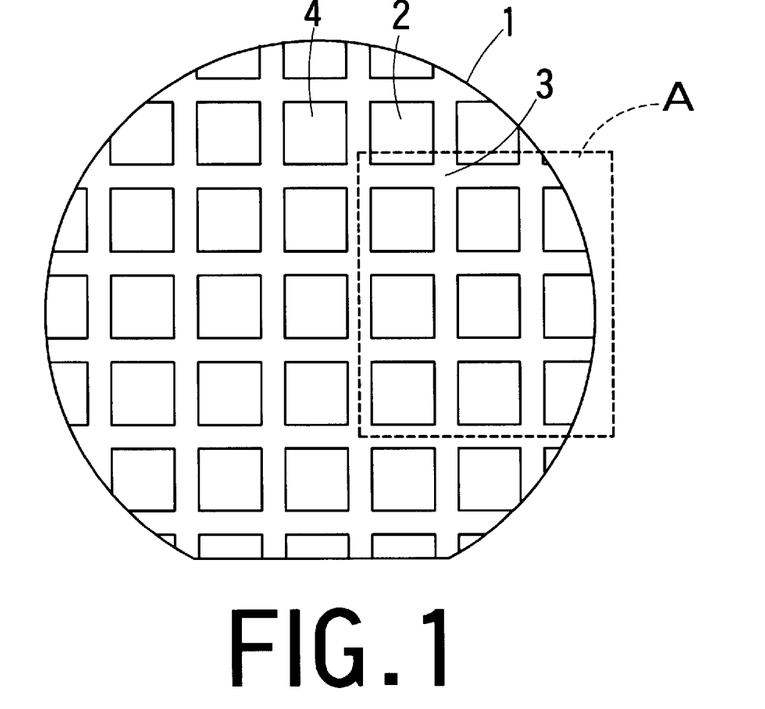
FIG. 1 is a plane view showing a first embodiment of the semiconductor wafer according to the present invention.
Figure 2:
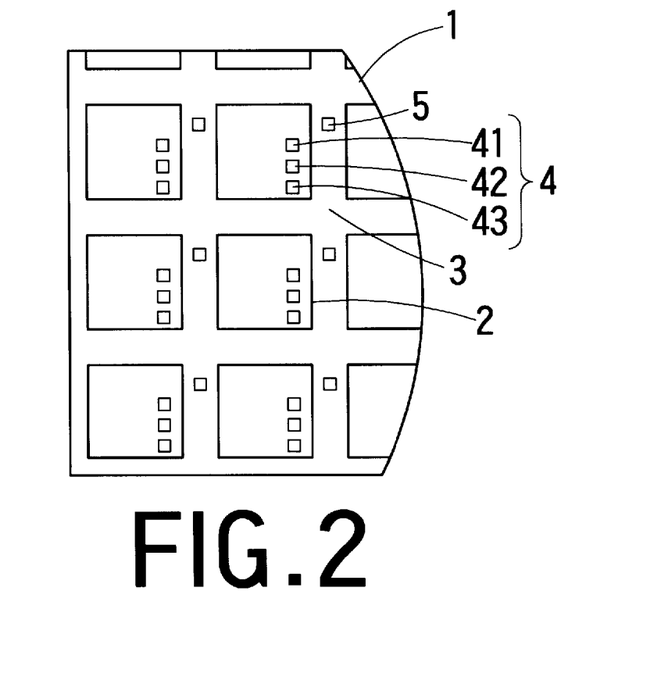
FIG. 2 is an enlarged plane view showing an region A shown in FIG. 1.

FIG. 1 is a plane view showing a semiconductor wafer; and FIG. 2 is an enlarged plane view showing a region A of the semiconductor wafer shown In FIG. 1. As shown in FIG. 1, a plurality of chip forming regions (referred to as product regions, hereinafter) 2 are formed in a matrix pattern on the principal plane of a semiconductor wafer 1 of silicon semiconductor, for instance. Further, a plurality of scribe lines or scribe regions 3 are formed between two of these product regions 2, respectively. Therefore, when the wafer 1 is cut away along these scribe lines formed on the wafer surface, respectively by use of a diamond blade or a laser cutter, the chips can be separated away from the wafer one by one.

The product regions 2 and the scribe regions 3 will be described in further detail hereinbelow with reference to FIG. 2. On the semiconductor wafer 1, a plurality of the product regions 2 each separated into a chip in the last step are arranged in a circular matrix pattern. Further, the scribe regions 3 are formed between two of these product regions 2. respectively. At the product region (i.e., chip) 2, an internal circuit composed of integrated circuits including a ROM, for instance is formed. Further, at the product region 2, a plurality of input and output pads (i.e., terminals) 41, 42, 43, . . . formed of aluminum and electrically connected to an external circuit are arranged. On the other hand, these input and output pads 41, 42, 43, . . . are all electrically connected to the internal circuit, and arranged at a peripheral portion, for instance of the product region 2. Further, a test pad 5 is also necessary together with these input and output pads. The feature of the present invention resides in the arrangement of the test pad 5 on the semiconductor wafer 1. In more detail, the test pad 5 necessary to test the IC is formed at the scribe region (on the scribe line) 3 adjacent to the product region 2. In this first embodiment, only a single test pad 5 is used in common as terminals for inputting and outputting test signals.

Therefore, when a code indicative of the start of the ROM test is inputted to the test pad 5, since a test control circuit 9 (shown in FIG. 3) recognizes this start code, the contents of the ROM 10 (shown in FIG. 3) are started to be outputted. Further, when the conditions decided by the test code can be established, since a ROM test end code is outputted from the control circuit to the test pad (the ROM terminal) 5 and further recognized and discriminated by a measuring system, the ROM test ends.

In the present invention, the die sorting test and the product test of the wafer 1 are both executed through this test pad 5, before the wafers 1 are cut away from the semiconductor wafer. Therefore, after the semiconductor wafer 1 has been once cut away into a plurality of the chips along the scribe lines 3, respectively, since the test pad 5 can be broken off and then lost, the contents of the semiconductor device put on the market as products will not be again known by another person. As a result, in the case of the semiconductor devices used for electronic transactions in particular, it is possible to prevent such danger that the contents of the ROM are decoded or deciphered and then used improperly ox illegally.

At the product regions (chip forming regions) 2 shown in FIG. 2, four pads are formed for each product region 2 by way of example, and only one 5 of these four pads is used as a test pad. In general, however, since the pads as many as 5 to 100 pieces are necessary for each chip, one to several test pads are usually used among these many pads.

Figure 3:
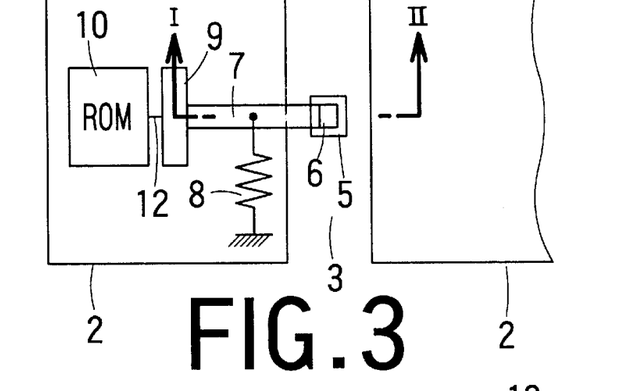
FIG. 3 is a schematic plane view showing an internal structure at the product region of the semiconductor wafer according to the present invention.

FIG. 3 is an enlarged schematic block diagram showing the test pad (ROM terminal) 5 formed on the semiconductor wafer 1 shown in FIG. 2. At the product region 2, the test control circuit 9 for controlling the ROM 10 and the ROM test is formed. The ROM 10 and the ROM control circuit 9 are connected to each other through a signal line 12 formed by a diffusion or poly silicon layer. Further, the test pad 5 is formed at the scribe region 3. Further, a diffusion region 7 is formed on the semiconductor wafer 1 so as to extend from the product region 2 over to the scribe region 3. The diffusion region 7 can be formed by implanting impurity ions such a As and P, for instance and used as a signal line connected between the test control circuit 9 and the test pad 5. Further, the diffusion region 7 and the test pad 5 are connected to each other via a contact hole 6 formed in an insulating film (not shown).

The test start code is inputted from the test pad 5 (used in common as the terminals for inputting and outputting test signals and formed on the scribe line 3) to the test control circuit 9 through the diffusion region 7. A point of the diffusion region 7 is grounded at the product region 2 via a resistance B formed by a diffusion or poly silicon layer. A measuring test circuit 15 (shown in FIG. 5) is constructed and connected on the side of the test pad 5 under due consideration of the grounded resistance 8. Therefore, when the test start code is recognized, since the test pad 5 is also used in common as an output terminal to the test signals, the ROM data can be outputted. In the ROM test, whenever the conditions previously decided by the test code are established, a ROM test end code is outputted from the test control circuit 9 to the test pad 5, and then discriminated by the measuring system, so that the ROM test ends.

The resistance 8 is used to ground the diffusion region (signal line) 7, in order to prevent the test pad (ROM terminal) 5 of the chip circuit from being used illegally, after the semiconductor wafer I has been scribed into the many chips. Further, the resistance 8 is used as of the measuring test circuit 15, before the semiconductor wafer 1 is scribed. The diffusion region 7 is connected to some active elements 18 and 24 (shown in FIG. 5) of the test control circuit 9.

Figure 4A:
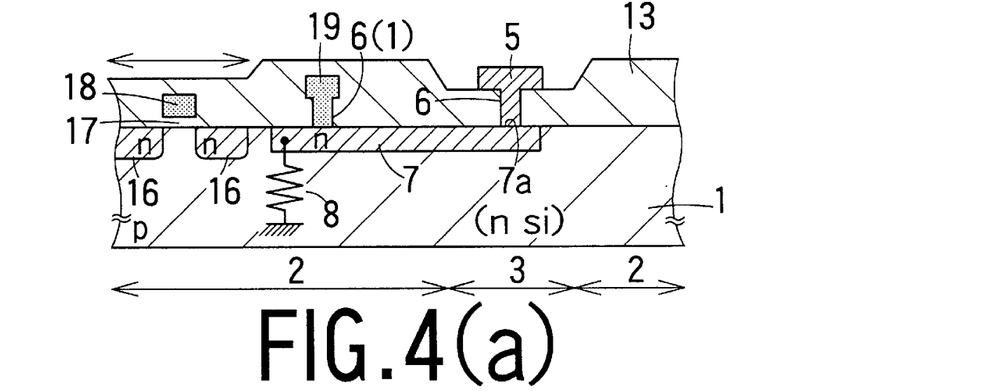
FIG. 4(a) is a cross-sectional view taken along the line I-II shown in FIG. 3.

FIG. 4(a) is a cross-sectional view taken along the line I-II in FIG. 3. The semiconductor wafer 1 is formed of an n-type silicon semiconductor, for instance. On the surface of the semiconductor wafer 1, the n-type diffusion region 7, for instance is formed so as to extend from the product region 2 over to the scribe region 3. Further, at the product regions 2 formed on the surface of the semiconductor wafer 1, an n-type source/drain region 16 of a MOS transistor Tr is formed to construct the test control circuit 9. Further, a gate electrode 18 formed of poly silicon is arranged via a gate oxide film 17 on the semiconductor wafer 1 and between the source/drain regions 16. The surface of the semiconductor wafer 1 including the gate electrode 18 is covered by an insulating film 18 formed of $SiO_2$, for instance. Further, the insulating film 13 is formed thin at only the scribe region 3, as shown in FIG. 4(a). The contact hole 6 is formed in the insulating film 13 at the scribe region 3, so that the pad 5 formed of aluminum can be connected to the diffusion layer 7 via this contact hole 6. Similarly, at the product region 2, a contact hole 6(*l*) is formed in the insulating film 13 to expose the diffusion region 7, respectively. Therefore, the gate electrode 18 of the transistor Tr can be electrically connected to the diffusion region 7 through the poly silicon wire 19 extending from the gate electrode 18 and via this contact hole 6(*l*). The grounded resistance 8 is formed at the diffusion region 7 of the product region 2.

Figures 4B, 4C:
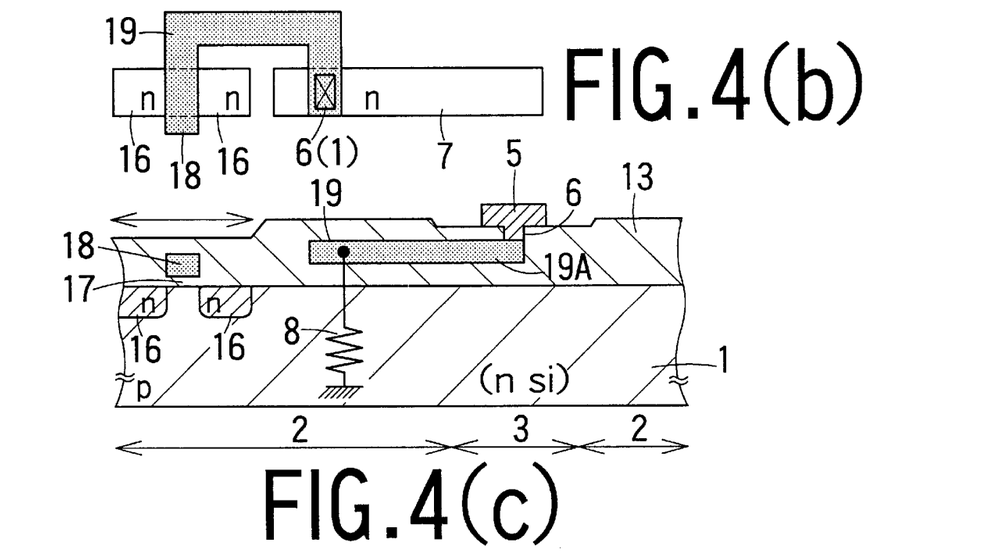
FIG. 4(b) is an enlarged partial cross-sectional view showing only a poly silicon wire shown in FIGS. 3 and 4(a)
FIG. 4(c) is a cross-sectional view of another embodiment.

As shown in FIGS. 3 and 4(a) and 4(b), the test pad 5 is formed at roughly the middle point of the scribe line (scribe region) 3 in the width direction thereof. Further, the length of one side of the test pad 5 is less than a half of the width of the scribe line 3. Therefore, when the semiconductor wafer 1 of the above-mentioned structure is cut away along the scribe line 3, the test pad 5 can be securely removed from the semiconductor chip 2. As a result, it is impossible for another person to steal data recorded in the integrated circuit (e.g. ROM) of the semiconductor device.

Further, it is preferable to form the diffusion region 7 as a buried layer by implanting ions from the surface of the semiconductor wafer. In this case, as shown in FIG. 4(a), a contact region 7a exposed to the surface of the semiconductor wafer is formed in contact with the contact hole 6 at the Junction portion between the test pad 5 and the metal wire (not shown). Here, the diffusion region 7 and the source/drain region 16 of the transistor can be formed in accordance with the same manufacturing process. For instance, the n-type diffusion region can be formed by the diffusion method of implanting ions such as P and As. Further, the signal line (the diffusion region) 7 can be formed by the ion implantation method. As the transistor, it is of course possible to use a p-channel MOB transistor.

Further, in this first embodiment, although the n-type diffusion region 7 is used as the signal line, it is of course possible to use a p-type diffusion region.

Furthermore, the test pad 5 and poly silicon wire 19 are connected via poly silicon wire 19A extending from the poly silicon wire 19.

Figure 5:
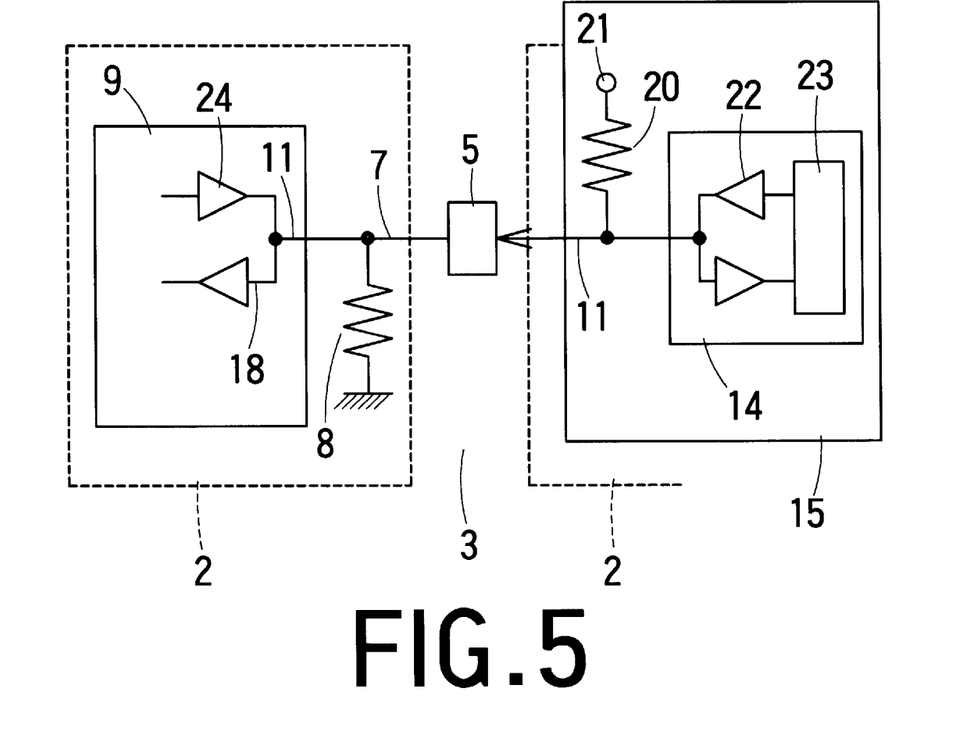
FIG. 5 is a schematic plane view for assistance in explaining the test operation of the semiconductor wafer according to the present invention.

FIG. 5 is a system block diagram for assistance in explaining the practical operation required to test the semiconductor wafer of the first embodiment. When the ROM is tested, a tester as shown in FIG. 5 is used. This tester 15 is composed of a test board 15 and a test circuit having a semiconductor evaluation device 14 formed on the test board 15. The ROMs can be tested one after another by bringing the signal line 11 connected to the semiconductor evaluation device 14 into contact with each test pad 5 formed on the semiconductor wafer 1. As the signal line 11, a needle 15a such as probe attached to a fixed card can be used. In the ROM test, the contents of the ROM at the product region (chip forming region) 2 formed on the semiconductor wafer 1 can be tested by inputting and outputting signals through the test pad 5.

The semiconductor evaluation device 14 formed on the test board 15 is composed of a resistor 20 connected to the signal line 11, a voltage supply 21 connected to the resistor 20, and a decision circuit 23 for evaluating the semiconductor device through input and output buffers 22. Here, the input and output buffers 22 are formed to connect the test control circuit 9 formed at the product region 2 to the diffusion region 7. Further, the grounded resistor 8, the two signal lines 7 and 11, the resistor 20, and the voltage Supply 21 constitute an external interface.

Figure 6:
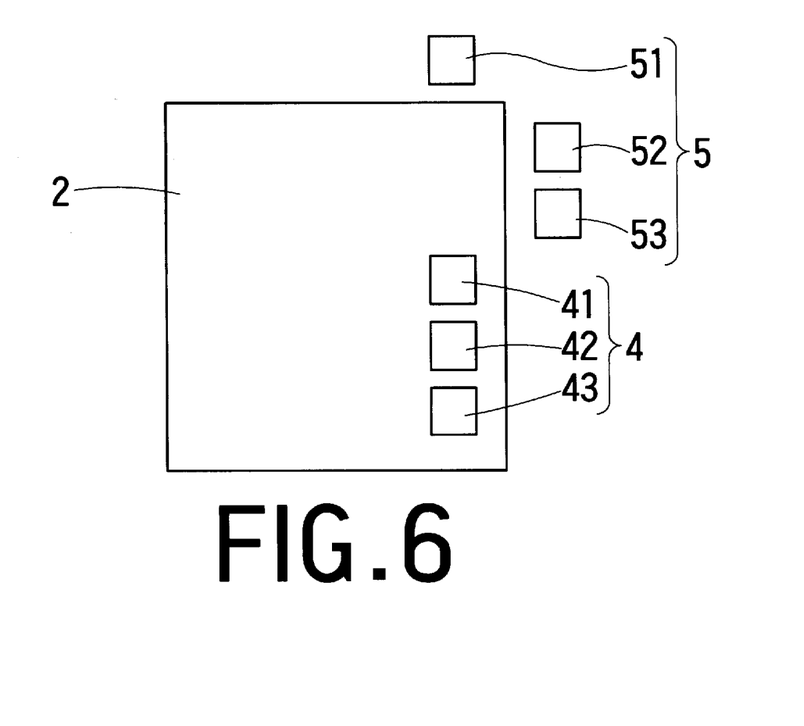
FIG. 6 is a partial plane view of another embodiment, showing a second embodiment of the semiconductor wafer according to the present invention.

A second embodiment will be described hereinbelow with reference to FIG. 6.

On the semiconductor wafer 1, a plurality of the product regions 2 each separated into a chip in the last step are arranged in a matrix pattern. Further, the scribe regions 3 are formed between two of these product regions 2, respectively. At the product region (i.e., chip) 2, an internal circuit composed of integrated circuits including a ROM, for instance is formed. Further, at the product region 2, a plurality of input and output pads (i.e., terminals) 41, 42, 43, . . . formed of aluminum and electrically connected to an external circuit are formed. These input and output pads 41, 42, 43, . . . are all electrically connected to the internal circuit, and arranged at a peripheral portion, for instance of the product region 2.

The feature of this second embodiment resides in the number of the test pads and the arrangement of the test pads on the semiconductor wafer. In more detail, a plurality-of the test pads 5 (51, 52, and 53) necessary for the ROM test are formed at the scribe region (on the scribe line) 3 adjacent to the product region 2. Here, however, the test pad 51 for inputting a test code signal to the ROM is arranged on the upper side of the product region 2 in FIG. 6. On the other hand, the test pad 52 for inputting signals to the writable ROM and the test pad 53 for outputting signals from the ROM are both arranged on the right side of the product region 2 in FIG. 6.

Therefore, when a code indicative of the start of the ROM test is inputted through the test pad 51, since a test control circuit 9 (shown in FIG. 3) recognizes this start code, the contents of the ROM 10 (shown in FIG. 3) are started to be outputted. Further, when the conditions previously decided by the test code can be established, since a ROM test end code is outputted from the control circuit to the test pad (the ROM terminal) 5 and further recognized and discriminated by a measuring system, the ROM test ends.

In the second embodiment, after the semiconductor wafer 1 has been cut away into a plurality of the chips along the scribe lines 3, respectively, since these test pads 51 to 53 can be broken off and lost, the contents of the semiconductor device put on the market as products can be prevented from being known by another person. As a result, in the case of the semiconductor devices used for electronic transactions in particular, it is possible to prevent such danger that the contents of the ROM are decoded or deciphered and then used improperly or illegally. Further, in this second embodiment, it is unnecessary to input and output signals in series through the some test pad, being different from the case of the conventional Wafer and the first embodiment wafer.

Figure 7:
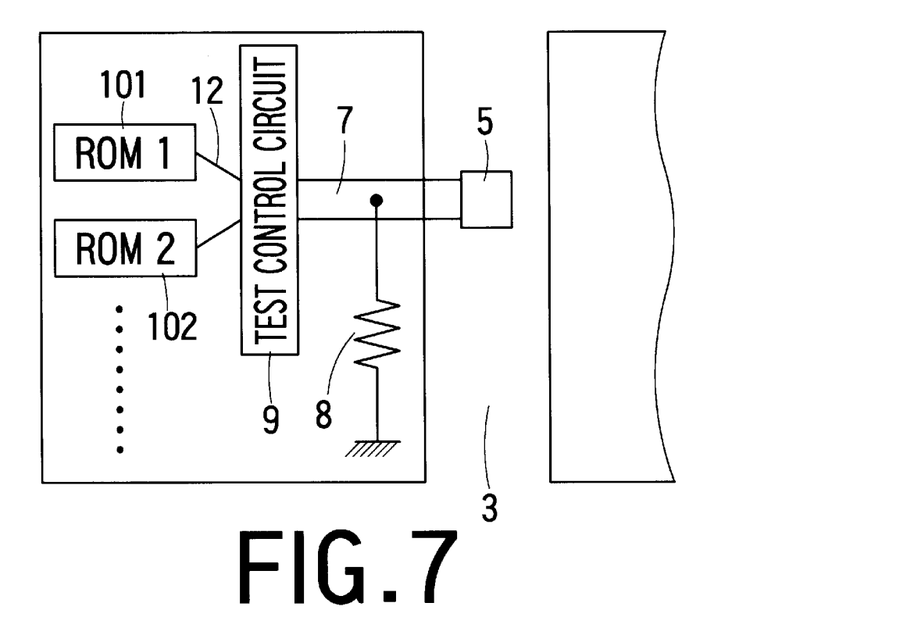
FIG. 7 is a schematic plane view showing an internal structure at the product region of a third embodiment of the semiconductor wafer according to the present invention.

A third embodiment will be described hereinbelow with reference to FIG. 7. FIG. 7 is an enlarged schematic plane view showing the test pad 5 formed on the semiconductor wafer.

The feature of this third embodiment is to form a plurality of ROMs at the same product region 2. Further, at the product region 2, a test control circuit 9 for controlling the ROM tests of a plurality of the ROMs (ROM 101, ROM 102, . . . ), respectively is formed. In other words, only a single control circuit 9 is connected to a plurality of the ROMs, respectively through a plurality of signal lines 12 each formed by a diffusion wire or a poly silicon wire. Further, the test pad 5 is farmed at the scribe region 3, and a diffusion region 7 is formed as a signal line on the surface of the semiconductor wafer 1 so as to extend from the product region 2 over to the scribe region 3.

The test start code is inputted from the test pad 5 (used in common as the terminal for inputting and outputting test signals and formed on the scribe line 3) to the test control circuit 9 through the diffusion region 7. A point of the diffusion region 7 is grounded at the product region 2 via a resistance 8 formed by a poly silicon layer. A measuring test circuit 15 (shown in FIG. 5) is constructed and connected on the side of the test pad 5 under due consideration of the grounded resistance 8.

Therefore, when the test start code is recognized, since the test pad 5 is used in common as an output terminal, the ROM data can be outputted. In the ROM test, whenever the conditions previously decided by the test code are established, a ROM test end code is outputted from the test control circuit 9 to the test pad 5 and further discriminated by the measuring system, so that the test ends.

In this third embodiment, since a plurality of the ROMs are formed on a single chip and since each of these ROMs is connected to the same test control circuit 9, it is possible to execute the ROM test one after another.

Figure 8:
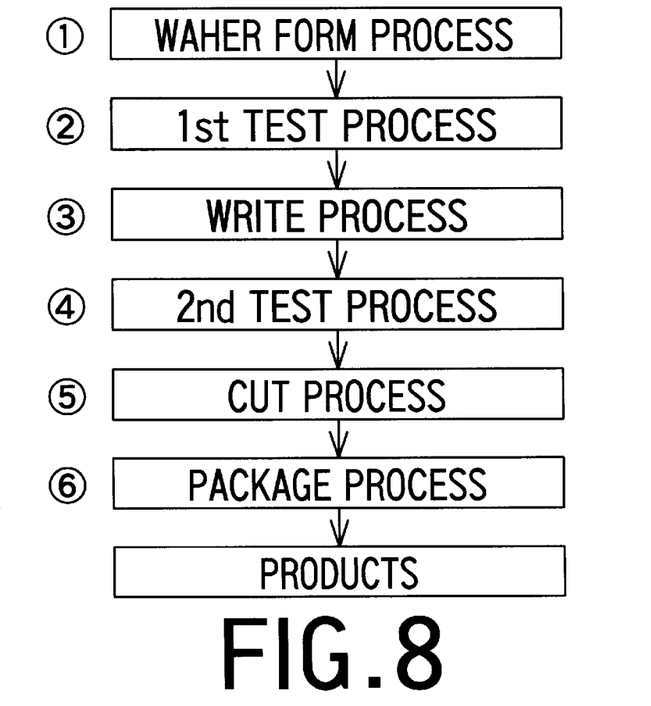
FIG. 8 is a flowchart showing the manufacturing process of the semiconductor device according to the present invention

The manufacturing process of forming the semiconductor devices by separating the chips from a single semiconductor wafer will be described hereinbelow with reference to FIG. 8. FIG. 8 is a flowchart showing the manufacturing process of the semiconductors device according to the present invention.

First, in step 1 (semiconductor wafer forming process), the product regions each including a ROM are formed on the surface of a semiconductor wafer. Further, the scribe lines are formed on the surface of the same semiconductor wafer, respectively. Further, the test pads are also formed on the scribe lines, respectively.

Secondly, in step 2 (first test process), the test is executed by checking whether data can be written in the ROM through the test pad or not, respectively. Further, at the same time, data already written in the ROM in the test process are read, respectively.

Thirdly, in step 3 (writing process), data are written in the ROM formed on the semiconductor wafer, respectively.

Fourthly, in step 4 (second test process), the test is executed by checking whether data have been written properly in the ROM formed on the semiconductor wafer through the test pad, respectively on the basis of the result of the first test process.

Fifthly, in step 5 (cutting process), the semiconductor wafer is cut away along the scribe lines, to separate the product regions as chips, respectively.

Sixthly, in step 6 (packaging process), the separated chips are all packaged as products, respectively.

In the above-mentioned semiconductor wafer forming process, the diffusion region or the poly silicon wire extending from the product region over to the scribe line is formed on the surface of the semiconductor wafer, in such a way that the test pad can be electrically connected to the ROM respectively.

As described above, in the semiconductor wafer according to the present invention, the ROM test can be executed on the semiconductor wafer by only the maker who can manufacture the semiconductor devices. Further, the ROM test will not be executed again even by the maker, after the semiconductor wafer has been once separated into a plurality of chips, respectively. Therefore, it is possible to obtain the semiconductor devices of a high secrecy.

Figure 10:
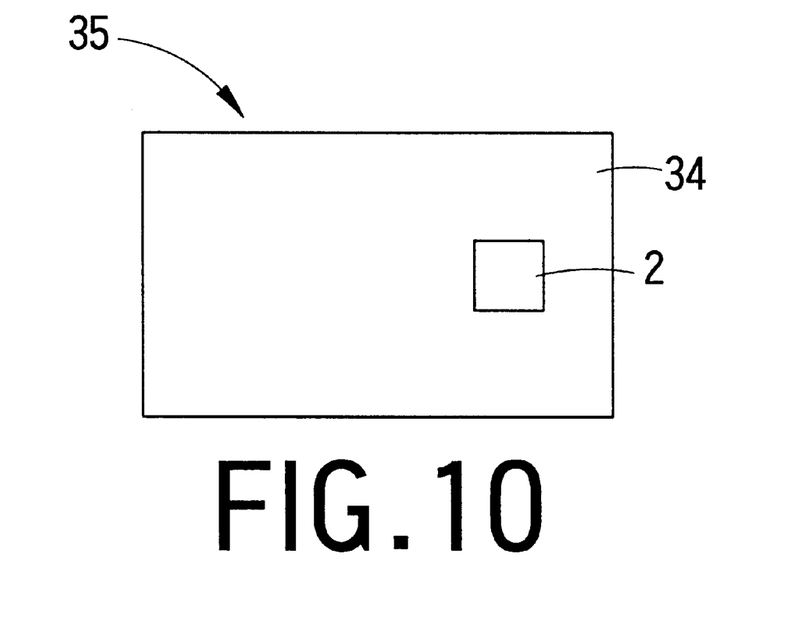
FIG. 10 is a plane view showing an IC card on which a chip tested according to the present invention is mounted.

FIG. 10 shows a rectangular IC card 35, in which a chip 2 of semiconductor device is mounted on a card-shaped external device 34. In this case, when the IC card 35 is used for electronic transactions or as electronic money, since the high secrecy can be maintained, it is possible to increase the security of the electronic transactions and the electronic money, with the result that the electronic transactions can be accepted by the public as comfort or safe means.

As described above, in the semiconductor wafer according to the present invention, the ROM test can be executed on the semiconductor wafer by only the maker. In addition, after the semiconductor wafer has been once separated into a plurality of chips along the scribe lines, respectively, since the ROM test will not be executed again even by the maker, it is possible to maintain the secrecy of the semiconductor devices in a high level. Further, since the diffusion region is used as the signal line, after the chips have been once separated from the semiconductor wafer, any additional special processing is not required for the chips in order to maintain the chip reliability. Further, since the diffusion region; that is, the signal line is grounded via a resistor, the integrated circuit formed on the chip separated from the wafer can be securely kept stable

What is claimed is:

1. A semiconductor wafer formed with a plurality of chips each having a ROM to be tested, comprising:

a plurality of product regions arranged in a matrix pattern on the semiconductor wafer and cut away into each chip having a ROM in which data are written;

a plurality of scribe lines each having a predetermined width and each formed between two of said product regions as a margin to separate said product regions from each other; and a plurality of test pads each formed on each of said scribe lines in the vicinity of each of said product regions in one-to-one correspondence to each product region so as to be used for ROM test, each of said test pads formed on each scribe line being broken off whenever each of said scribe lines is cut away to disable the ROM test from being executed, wherein each test pad is formed on each scribe line adjacent to each product region corresponding to each test pad, wherein each test pad and each product region corresponding to each test pad are electrically connected to each other by a diffusion region or poly silicon wire formed on a surface of the semiconductor wafer so as to extend from each product region over to each scribe line on which each test pad is formed, wherein the diffusion region or poly silicon wire is in contact with each test pad at one end thereof and in contact with a test control circuit formed at each product region at the other end thereof, to control the ROM test, and wherein the diffusion region or the poly silicon wire is grounded via a resistance.

2. The semiconductor wafer of claim 1, wherein each test pad is formed at roughly a middle point of each scribe line.

3. The semiconductor wafer of claim 1, wherein the diffusion region is electrically connected to the test control circuit by a wire brought into contact with the other end of the diffusion region and into contact with a gate of a switching transistor or output transistor formed on an input/output terminal side of the test control circuit.

4. The semiconductor wafer of claim 3, wherein the wire is a poly silicon wire extending to the gate integral with the gate so as to be electrically connected to the gate.

5. The semiconductor wafer of claim 1, wherein a plurality of the ROMs are formed on each of said product regions.

6. A semiconductor wafer formed with a plurality of chips each having a ROM to be tested, comprising:

a plurality of product regions arranged in a matrix pattern on the semiconductor wafer and cut away into each chip having a ROM in which data are written;

a plurality of scribe lines each having a predetermined width and each formed between two of said product regions as a margin to separate said product regions from each other; and a plurality of test pads each formed on each of said scribe lines in the vicinity of each of said product regions in one-to-one correspondence to each product region so as to be used for ROM test, each of said test pads formed on each scribe line being broken off whenever each of said scribe lines is cut away to disable the ROM test from being executed, wherein each test pad and each product region corresponding to each test pad are electrically connected to each other by a diffusion region or poly silicon wire formed on a surface of the semiconductor wafer so as to extend from each product region over to each scribe line on which each test pad is formed, and wherein the diffusion region or the poly silicon wire is grounded via a resistance.

7. The semiconductor wafer of claim 6, wherein each test pad is formed on each scribe line adjacent to each product region corresponding to each test pad.

8. The semiconductor wafer of claim 6, wherein each test pad is formed at roughly a middle point of each scribe line.

9. The semiconductor wafer of claim 6, wherein the diffusion region or poly silicon is in contact with each test pad at one end thereof and in contact with a test control circuit formed at each product region at the other end thereof, to control the ROM test.

10. The semiconductor wafer of claim 9, wherein the diffusion region is electrically connected to the test control circuit by a wire brought into contact with the other end of the diffusion region and into contact with a gate of a switching transistor or output transistor formed on an input/output terminal side of the test control circuit.

11. The semiconductor wafer of claim 10, wherein the wire is a poly silicon wire extending to the gate integral with the gate so as to be electrically connected to the gate.

12. The semiconductor wafer of claim 6, wherein a plurality of the ROMs are formed on each of said product regions.

* * * * *